United States Patent [19]  [11] 3,969,165
Henderson  [45] July 13, 1976

[54] SIMPLIFIED METHOD OF TRANSISTOR MANUFACTURE

[75] Inventor: William B. Henderson, Marina Del Rey, Calif.

[73] Assignee: TRW Inc., Los Angeles, Calif.

[22] Filed: June 2, 1975

[21] Appl. No.: 582,736

[52] U.S. Cl. .............................. 148/187; 148/188
[51] Int. Cl.² ........................................ H01L 21/22
[58] Field of Search ............... 148/187, 188; 29/578

[56] References Cited
UNITED STATES PATENTS

| | | | |
|---|---|---|---|
| 3,266,127 | 8/1966 | Harding et al. | 148/1.5 X |
| 3,585,089 | 6/1971 | Preece et al. | 148/187 |
| 3,670,403 | 6/1972 | Lawrence et al. | 29/578 X |
| 3,707,410 | 12/1972 | Tauchi et al. | 148/187 |
| 3,771,218 | 11/1973 | Langdon | 148/187 X |

Primary Examiner—L. Dewayne Rutledge
Assistant Examiner—J. M. Davis

[57] ABSTRACT

An improved method for the manufacture of semiconductor devices which shortens the processing steps leading to metallization is disclosed. The present invention utilizes a controlled silicon etch process which allows emitters to be diffused into both the emitter and base sites. Undesired emitters are then removed from the base sites prior to metallization which enables the semiconductor devices to be manufactured in fewer numbers of steps than that required by the prior art processing techniques. The invented method for forming a contactual region in a semiconductor substrate having a planar base region comprising the steps of forming at least one opening through an insulating layer on the substrate. Next, an impurity is diffused into the substrate through the opening to form a base region. A passivating layer is then disposed over the insulating layer and the opening. A pattern is etched through the passivating layer so as to expose a selected area in the base region of the substrate. A second impurity is now diffused into the base region through the pattern forming the emitter regions. Finally, undesired emitters are removed, and the device is ready for metallization.

15 Claims, 22 Drawing Figures

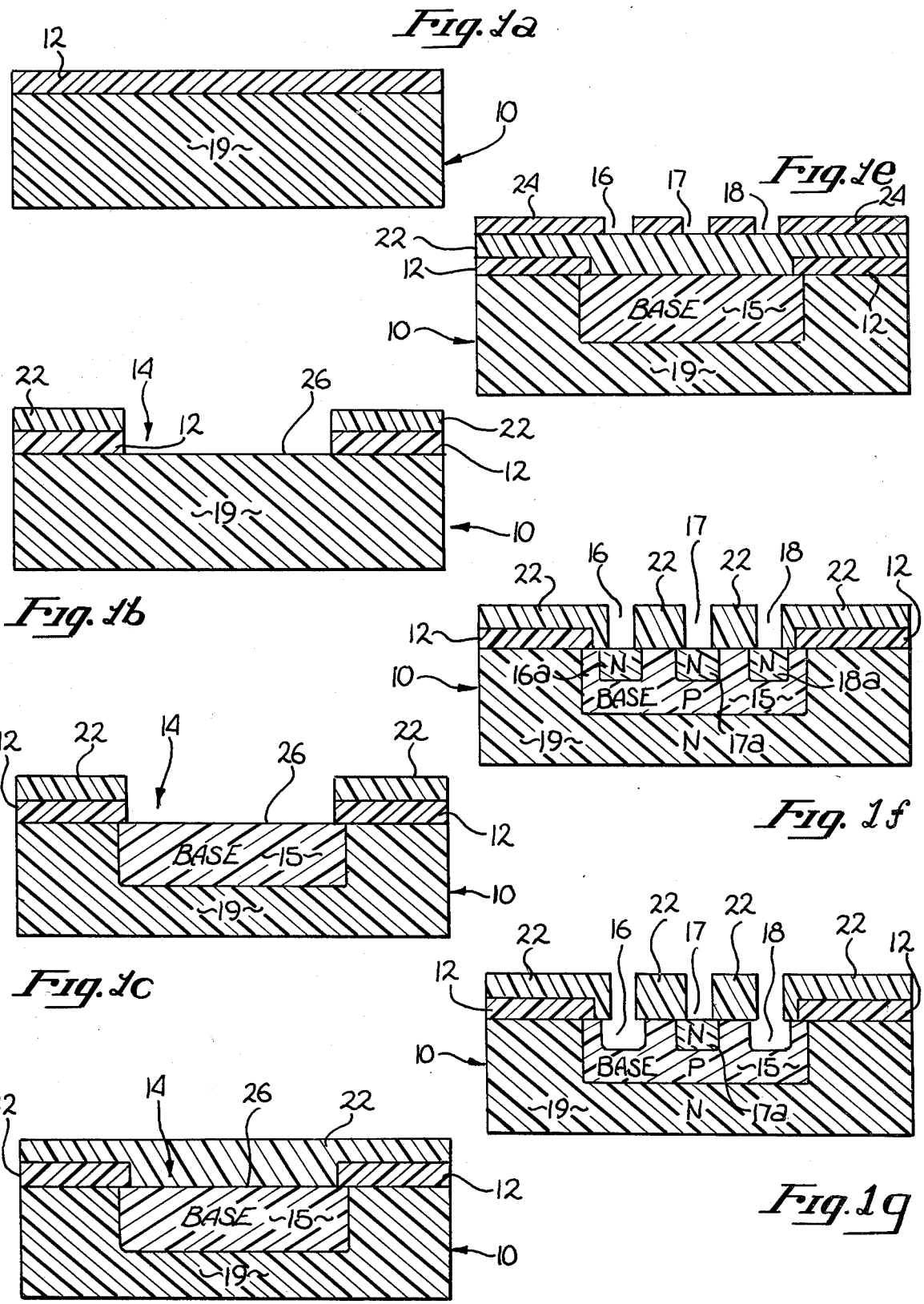

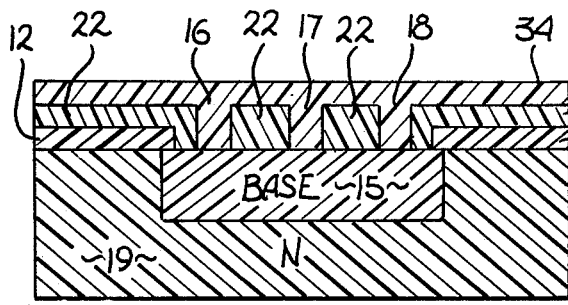
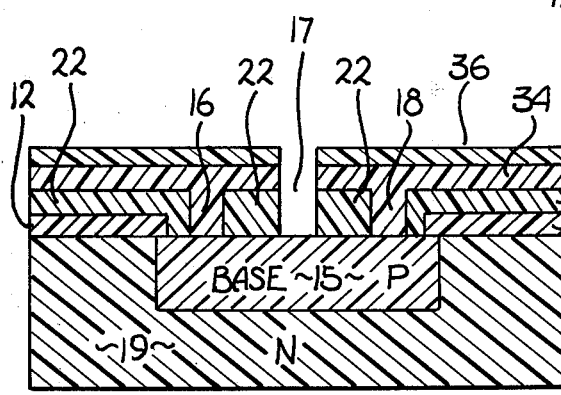
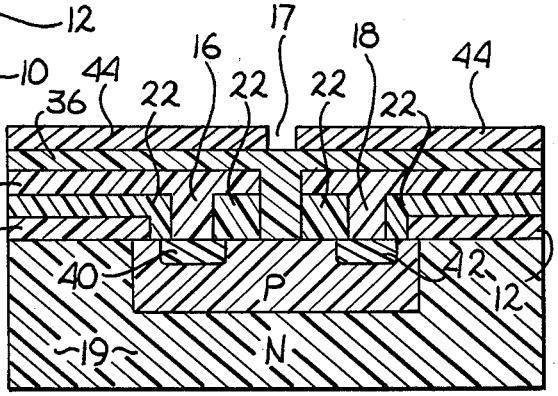
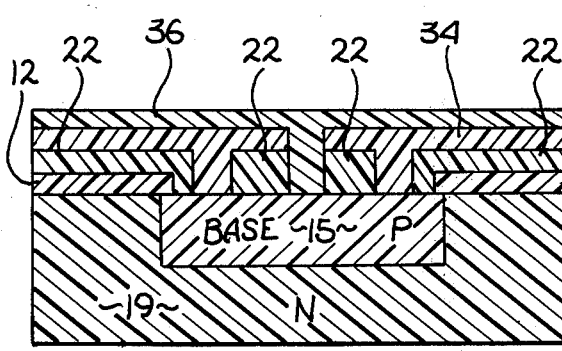
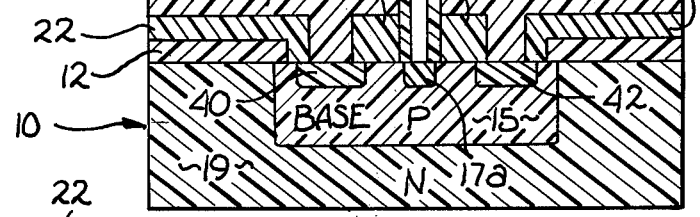
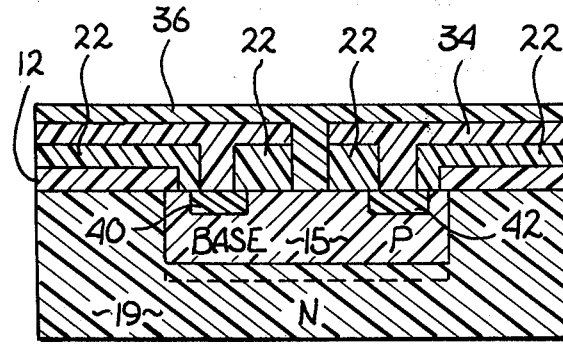
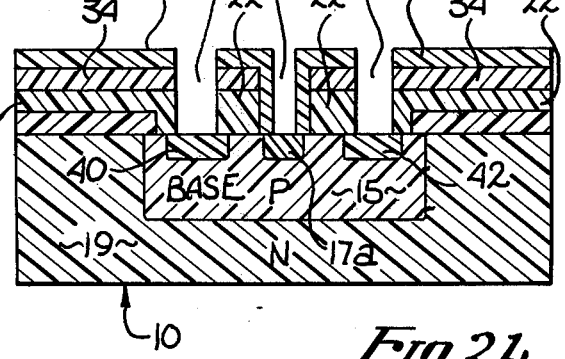

SIMPLIFIED METHOD OF TRANSISTOR MANUFACTURE

BACKGROUND OF THE INVENTION

1. Field of the Invention

This invention generally relates to improved processing techniques for the production of semiconductor devices, and, more particularly, to a method of fabricating semiconductor transistors whereby the glass deposition and driving steps normally preceding the creation of diffused emitter sites are eliminated.

2. Prior Art

In the manufacture of semiconductor devices and integrated circuits, the standard method of processing locked geometry type transistors such as diffused junction transistors, involves a substantial number of steps, for example, a 12 step process prior to metallization is not uncommon. The old method has the disadvantage of longer cycle times and requires a significant number of heating and photoresist steps which may adversly affect production yields.

The use of diffused junction transistors is well known in the art. Generally these devices are formed by junction between semiconductor layers each having a conductivity type which is reverse to the other, i.e., by a P-N junction. These devices have been traditionally produced by introducing a donor or acceptor impurity into the semiconductor substrate by means of known diffusion techniques. In the diffusion technique, after a window is formed in a masking layer provided on the surface of the semiconductor substrate, an impurity, such as, for example, phosphorous, arsenic, boron and the like is introduced from a vapor phase or a solid phase. The impurity diffuses into the semiconductor and forms an active region.

The construction of a semiconductor element prepared by selectively diffusing an impurity through a mask consisting of an insulating coating or film by a process as mentioned hereinabove, is known as "planar structure." To form this planar structure, a mask comprising an insulating layer having openings or windows which terminate at the surface of a semiconductor is used to diffuse the impurity of different conductivity type from that of the semiconductor substrate. This forms the base region in the substrate. Thereafter, a second insulating layer is formed to cover said windows, and a second set of windows are formed to diffuse therethrough another impurity having a different conductivity type from the base region to form the emitter regions. The windows through the insulating layer covering the semiconductor surface, are typically formed by well known photo-etching techinques.

In forming the second set of windows through the insulating layer in the prior art method, it is necessary to closely control the positions thereof, and it is generally accepted that as the number of process steps required to form these windows through the insulating film is increased, the difficulty of closely controlling the positions of the perforations will be increased. Thus, for example, to prepare transistors of double diffusion type, a total of the three photo-etching steps are generally required. This process is known as "mask aligning operation" because it includes a step of aligning a pattern on the mask with a pattern formed on the semiconductor wafer by manipulating a photographic negative. Thus, the prior art required three basic mask aligning operations. In order to prepare high frequency micro wave diffused transistors, these mask aligning operations must be carried out with an accuracy of from 0.25 to 1.00 microns. And since an increase in the number of mask aligning operations results in an increase in the probability of deviation between the mask pattern and the pattern on the semiconductor substrate, the number of satisfactory transistors formed on a single wafer, is usually reduced, thus decreasing the yield of satisfactory products. It is also to be noted that extremely high quality and expensive apparatus are required to perform such mask aligning operations with high accuracy. Moreover, there are many engineering problems to be solved. for example, the masks themselves are expensive and the mask aligning operations require much time.

More specifically, a conventional 12 step method for manufacturing a locked geometry type transistor is shown in FIG. 1 and will be briefly described. As a first step, a silicon oxide layer having an opening in a predetermined area on one flat face of a P or N-type silicon single crystal is formed and a base region of opposite polarity, for example, a P-type region is created by selectively diffusing a P-type impurity through the opening. Thereafter, a second layer of silicon dioxide is formed on the N-type base region, and additional openings are again disposed therethrough by removing a predetermined protion of the silicon dioxide. A P+ glass is then deposited through the latter openings to form a contact area on the silicon substrate in the base region. An additional passivation coating is next deposited over the P+ glass, and the base drive and P+ drive are completed by heating the wafer in a furnace. Thereafter, N-type emitter regions are defined through the passivation layer utilizing known photo-etch and diffusion techniques. Then another photomasking operation is required to define the base contact regions. Finally, metal interconnects are defined through etched windows so as to be in contact with the desired emitters and P+ regions.

Such conventional methods thus requires more than 10 steps to metallization. In addition, the method requires longer cycle times and various heating and photoresist steps that can lower yields. For example, typical temperature ranges and time periods for processing microwave semiconductors in the aforementioned base diffusion step are approximately 900° to 1125°C for ¼ to 2 hours.

To overcome this long processing technique, the prior art has disclosed a number of semiconductor fabrication methods. However, the disclosed methods have attacked the problem by improving the masking processes, the fabrication techiques of the masks, and in the design of transistor circuit structures themselves. But the prior art has not significantly reduced the number of processing steps. For example, Lawrence et al., U.S. Pat. No. 3,670,403, disclose a three resist-masking step process for producing field effect transistors. The process includes the steps of depositing on a silicon wafer, sequential layers of protective oxide, silicon nitride, and field oxide followed by the first masking step forming the source and drain regions. Next, an activator impurity and glass are deposited and the second masking step takes place defining contact holes and gate openings using the silicon nitride as an etch stop. Finally the third mask delineates the contact metallization. While this process is disclosed as lowering costs, alignment of each of the masks is difficult and time consuming, and the number of steps is still significant.

In another prior art process disclosed by Tauchi et al., U.S. Pat. No. 3,707,410 another method of manufacturing semiconductor devices is disclosed. This method includes the steps of introducing a first impurity through a mask into a substrate to form a first doped area, followed by a second impurity with a diffusion constant which is greater than that of the first impurity. The problem with such a process is that inasmuch as it is difficult to control the depth an impurity will penetrate into the substrate during a heating step, a double diffusion process compounds an already difficult procedure.

Another prior art process disclosed by Harding et al., U.S. Pat. No. 3,266,127, also points up the problem of multiplicity of steps involving great accuracy and/or heating. In the Harding et al. method of forming contacts on semiconductors, first an interconnection metal is deposited in a desired pattern on an oxide coated semiconductor. A contact area is etched through a portion of the interconnection and through the oxide coating to the surface of the semiconductor. This is followed by selectively depositing an aluminum omic contact in the etched area so as to cover the oxide-free semiconductor surface including an area somewhat larger in size than the etched area. Finally the semiconductor is heated to a temperature sufficient to cause alloying of the contact with the oxide-free surface of the semiconductor.

Even those improved prior art methods such as disclosed by Preece, U.S. Pat. No. 3,585,089 which do attack the problem of the great number of difficult processing steps, have only been able to reduce the number to approximately nine. In Preece, PN junctions are formed by well known techniques such as oxide masking and impurity diffusion. Next a silicon nitride layer is deposited followed by the etching of contact windows. While Preece may reduce the number of steps, the specific steps involved are those requiring a high degree of accuracy and those likely to result in poor reliability, namely, heating the wafer to high temperatures. Thus, while Preece does alleviate the time problem associated with a 12-step process, the process still includes steps which adversely affect production yields.

The present invention is directed towards a method to increase yields and improve the reliability of junction transistor devices and diodes. The present invention is more direct and less costly because fewer steps are necessary to produce locked geometry type transistors. Further, inasmuch as the steps are relatively straight forward, not requiring exacting techniques, the devices thus produced are more reliable.

SUMMARY OF THE INVENTION

The present invented technique is applicable in the fabrication of semiconductor integrated circuits or devices wherein an insulating layer (e.g., silicon dioxide, silicon nitride, etc.) is established on the surface of a body of semiconductor material, such as, for example, a P or N-type silicon single crystal. The wafer includes openings therethrough (sometimes referred to as a "windows") used to expose portions of the semiconductor surface to which it is desired to establish an electrical contact. While the present invention method is primarily for use in planar structures it is also applicable to mesa structures in isoplanar structures. The electrical contact is formed by a conductive layer contacting the exposed semiconductor substrate and most often overlying portions of the insulating layer to define interconnections. The present invention substantially eliminates the critical processing steps previously used to form the emitter regions and contact areas thereto in a semiconductor device. In addition, the invented method eliminates critical alignment steps and steps requiring high temperature, yet produces the same semiconductor device with the same capabilities as those which include these shortcomings.

Briefly, the presently preferred embodiment involves the steps of forming at least one opening through a silicon oxide layer formed over for example, an N-type silicon substrate. Next, a P-type base region is formed by selectively diffusing a P-type impurity through the opening. Thereafter a second layer of silicon dioxide forming a passivating layer is disposed on the P-type base region, and openings are again formed by removing a predetermined portion of the passivating layer. An N-type impurity is then diffused through this opening to form N-type emitter regions. Finally, undesired emitter regions are removed by known silicon etch techniques. This step represents an important point of novelty of the invented method. Because the controlled silicon etch process allows emitters to be diffused both in the emitter and base sites simultaneously, after which some of them would be sites namely in the base region are removed prior to metallization. Thus, fewer processing steps are required to form a typical diffused transistor. Moreover, the present invention can also be utilized in similar type processing such as in the formation of diodes and diffused mesa transistors. For example, in forming mesa transistors, base and emitters are diffused in raw wafers, mesas are then etched to define the active regions, and unwanted emitter areas are etched out to afford base contacts. The present invention may also be used to expose active regions in any semiconductor device having at least a first and second active region in a minimal number of steps. For example, assume a device has a substrate which forms one active region. An insulating layer may be disposed thereon followed by forming a plurality of openings through this layer. Next the second active region is formed by diffusing an impurity with a different conductivity type from the substrate through the openings. Finally, undesired second regions are removed thus producing a device having two active regions in a few number of relatively easy steps.

It is therefore one object of the present invention to eliminate processing steps for defining emitter and base regions.

Another object of the present invention is to provide a method for producing junction transistors in high yields.

Yet another object of the present invention is to produce a device which has the same characteristics as a locked geometry PNP or NPN contact diffused device in fewer number of diffusion steps.

The novel features which are believed to be characteristic of the invention, both as to its organization and method of operation, together with further objectives and advantages thereof, will be better understood from the following description considered in connection with the accompanying drawings in which a presently preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1a through 1g are partial cross sectional views of a transistor structure at separate stages of manufacture in accordance with a first embodiment of the present invented method.

FIG. 2f through 2l are partial cross sectional views of a transistor structure at separate stages of manufacture in accordance with known prior techniques.

DESCRIPTION OF THE PREFERRED EMBODIMENT

Broadly, the invention involves a method for processing locked geometry type transistors in a seven step process prior to metallization.

Figure 3:
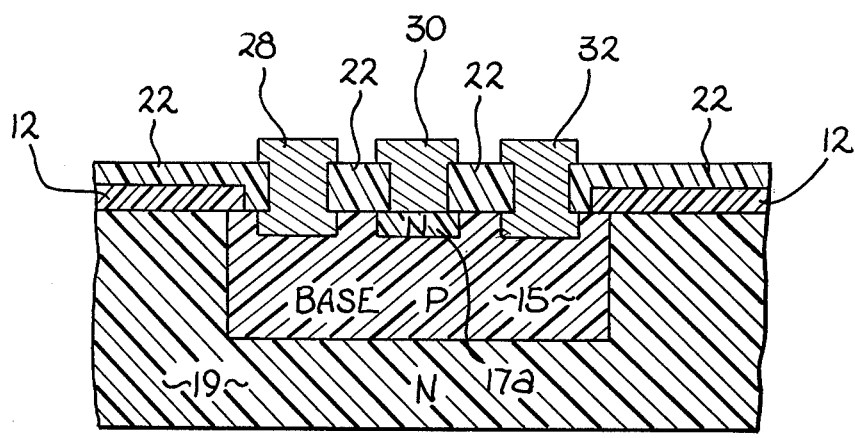
FIG. 3 is a partial cross sectional view of the transistor structure manufactured in accordance with the first embodiment of the present invention.

The present invented method is typically out to fabricate a transistor "chip" 10 also referred to as a "wafer" best seen by reference to FIG. 3. Transistor chip 10 is fabricated from a semiconductor wafer which is typically of N-type conductivity, but other conventional semiconductor materials and doping can be utilized. The wafer 10 comprises a substrate or collector region of the same N-type conductivity shown as the collector region 19 of the chip 10. Base region 15 is formed in the chip 10 with emitter region 17a being disposed within the base region in a manner which creates the regions as indicated in FIG. 3. The base and emitter region 15 and 17a respectively are formed by the execution of the requisite steps of the present invented method. Electrical contact to the active regions of transistor chip 10 can be made by disposing metal contact layers such as, for example, metal layers 28, 30 and 32 into the base and emitter regions. Metal contact layers 28, 30 and 32 are fabricated of conventional contact metal such as, aluminum and the like. These contact layers are disposed upon the base 15 and the emitter 17a by conventional methods such as vacuum evaporation. The electrical integrity of the metal contacts as well as the various active regions of the chip 10 are maintained by insulating layer 12.

Referring now to FIGS. 1a–1g, a substrate 19 is illustrated which may be a P-type or N-type substrate. In the presently preferred embodiment, substrate 19 is an N-type substrate. In FIG. 1a it is assumed that it is necessary to form contacts such as ohmic contacts with underlying regions in the substrate, such as base and emitter regions 15 and 17a respectively as indicated in FIG. 3. Substrate 19, also referred to as collector region 19, represents a semiconductor substrate consisting of, for example, a single crystal of silicon or germanium and having substantially a flat upper surface which serves as the collector region in planar type transistors.

In FIG. 1a a first insulating layer 12 of silicon dioxide (SiO) is thermally grown or otherwise deposited on the surface of the substrate 19. In a typical procedure, the silicon substrate 19 is heated in a furnace for 30–60 minutes at 1000°C to form a silicon dioxide layer approximately 500–10,000 A thick. Silicon dioxide is the presently preferred insulating layer, however, other insulating layers such as, for example, silicon nitride, aluminum-silicate glass (AlO SiO) and the like, are also within the scope of this invention. Through the use of conventional photolithographic techniques, a contact window or opening is formed by etching away insulating layer 12 where desired by selective removal of a base photoresist 23. For example, base photoresist mask 23 is laid down upon the silicon dioxide layer 12 and a pattern exposed thereon whereby a selected portion of layer 12 is subsequently exposed and removed. In the presently preferred embodiment buffered hydrofluoric acid was to remove the $SiO_2$ layer 12 although other means known in the art to remove $SiO_2$ may be also used. The underlying substrate surface 26 is opened, as indicated in FIG. 1b at opening 14 due to partial removal of mask 23. The exposed area of substrate 19 becomes the base diffusion region 15 in which the emitter region will be subsequently diffused thereby forming a diffused junction transistor. In the presently preferred embodiment, the opening 14 covers an area of approximately 10–1000 thousandths of a square inch. The photolithographic steps defined hereinabove have no critical alignment requirements inasmuch as this masking step itself defines the active regions to be subsequently formed in the semiconductor substrate 19.

Now referring to FIG. 1c, the silicon oxide layer 12, has been removed in a predetermined pattern, and a P-type base region 15 is formed by selectively diffusing a P-type impurity through the opening 14. The P-type impurity is driven into an upper region of the substrate 19 by well known techniques which requires the substrate to be heated for 15–30 minutes at approximately 1000°C. In the presently preferred embodiment, the P-type base region 15 is formed by diffusing boron through opening 14 which forms a region having a depth in the substrate surface 26 of about 3,000–10,000 A. However, other impurities such as, for example, gallium, indium and the like are also within the scope of this invention which form regions having various depths. After the base photoresist 23 is completely removed, a passivating layer 22, such as, for example, silicon dioxide is disposed over the first silicon dioxide layer 12 and the opening 14 as indicated in FIG. 1d. The passivating layer 22 is formed utilizing well known techniques and has a thickness approximately equal to that of the insulating layer 12. In the present embodiment the insulating layer 12 and the passivating layer 22 form a substantially homogeneous layer over the substrate 19. However, different, non-homogeneous insulating and passivating layer may also be used.

Referring now to FIG. 1e, a second layer of photoresist, layer 24, is now deposited upon the passivating layer 22. The photoresist is developed and selectively removed to form the geometry locking photoresist mask 24 defining the emitter openings 16, 17 and 18 which are subsequently made in passivating layer 22 to expose the selected areas of the substrate 26 in the base region 15. The procedure defined hereinabove is a gross masking step inasmuch as registration errors of the contact openings with respect to the base region 15 are not critical. The portion of the passivating layer 22 not protected by photoresist, is etched away by a suitable etchant such as a solution of hydrofluoric acid thus defining the emitter regions. The photoresist is then removed by conventional solvents and the remaining portions of passivating layer 22 act as a mask for the subsequent diffusion step. The silicon dioxide etch thus extends areas 16, 17 and 18 to the surface 26 of the substrate 19 as shown in FIG. 1f.

As N-type impurity is then selectively diffused through the latter openings to form N-type emitter regions 16a, 17a and 18a in an upper region of the base 15. In the presently preferred embodiment, the emitter regions each have a strip width of about 1–5 microns and a depth of about 1500–5000 A. This step also requires the substrate 19 to be heated to approximately 930°–1000°C for 10–30 minutes.

Because of the theory behind the junction transistor, the polarity of the base and collector region must be the opposite. For example, if the base is P-type, then the collector region must be N-type. In addition, the emitter region hereinafter discussed, must have the opposite polarity with respect to the base region. In the presently preferred embodiment, the base region 15 is P-type and thus the emitter regions must be N-type. To form the N-type emitter regions, phosphorous is diffused into areas 16, 17 and 18, however other impurities can be used to form the N-type emitter regions, such as, for example, arsenic and the like. Another photoresist layer (not shown) is then applied, developed and selectively removed such that only undesired emitters are exposed. For example, in the present invention, the substrate 26 is exposed where emitters 16a and 18a are located. Next, in the seventh and final step, FIG. 1g, the exposed emitters 16a and 18a are etched out using any known silicon etch techniques, such as, for example an anisotropic nitric acid/ammonium fluoride etchant which further extends areas 16 and 18 into the base region 15. This step is one of the most important steps of the invented process and represents a point of novelty and advancement over the known method of forming active areas in a silicon substrate. Of course, this step of etching out selected active areas in the substrate can be used in the manufacture of other devices such as diodes and the like.

The semiconductor is now ready for metallization. Shown in FIG. 3, metal contacts 28, 30 and 32 are formed by prior art metallization and etching techniques. Metal contacts 28 and 32 are disposed into the base region 15, where the undesired emitters originally were located, while metal contact 30 is disposed to emitter 17a, the emitter region which was not etched away. Thus the method steps of the first embodiment of the present invention are presented. As indicated in the FIGS. 1a–g, only seven process steps are needed to form a junction transistor ready for metallization. However to more fully point out the advantages of decreasing the number of steps, a discussion of the 12-step prior art method will be presented. It should be noted, however, that in the prior art method not only are more steps needed to reach the same point as the present invention, but the complexity of several of the prior art steps is much greater. In addition several of the steps require exacting techniques and/or heating both of which tend to reduce yields.

Steps shown in FIGS. 1a through e are the same in the prior art as in the invented invention. However, after the geometry locking photoresist mask 24 is defined (shown in FIG. 1e) and subsequently removed (after forming the openings 16, 17 and 18), the prior art deposites a layer of a heavily P+ doped glass 34 (FIG. 2f). The P+ glass 34 fills the openings 16, 17 and 18. Next a layer of photoresist 35 is applied over the glass layer 34, developed, and selectively removed so as to allow an etchant to open area 17 in the glass exposing the surface 26 of the substrate 19 (FIG. 2g). The site that is exposed will eventually become the emitter site.

Another layer of passivation 36 is applied over the glass 34 (the photoresist layer 34 has subsequently been removed). This layer 36 is necessary inasmuch as it protects the exposed surface 26 from impurities and the like. In FIG. 2i, the chip 10 has been placed in a furnace and heated to approximately 1100°C for about 60 minutes to drive the impurity from the P+ doped glass layer 34 into the surface 26 at openings 16 and 18 thereby forming contact sites 40 and 42. The heating also causes the base region 15 to further diffuse into the substrate 19 thus completing the base drive.

The emitter photoresist layer 44 is now applied over the passivating layer 36, (FIG. 2j) developed, and selectively removed as to allow an etchant to remove the passivating layer 36 and thereby expose area 17 in the substrate surface 26 (FIG. 2k). Again the wafer 10 must be heated so as to permit the diffusion of an N-dopant into area 17 thus forming the emitter region 17a. A final layer of photoresist is applied, developed, and selectively removed so as to expose the passivating layer 36 in areas 16 and 18 which are subsequently removed thereby exposing contact sites 40 and 42 (FIG. 2l). The wafer 10 is now ready for metallization.

One can easily see that FIG. 1g and FIG. 2l are substantially the same thus indicating that the device produced by the invented process does not differ from that outlined by a process requiring at least five additional steps.

From the foregoing discussion of FIG. 2f through l, one can also see that the prior art method has the severe disadvantage of large cycle times. For example, heating and masking steps are required to drive the P+ doped glass. Elimination of these steps is particularly important inasmuch as temperature adversely effects transistors. And these masking steps must be done in extremely accurate manner to prevent rejects. Moreover, the numerous application of photoresist requires accurate techniques in its application, development, and removal.

The presently invented method eliminates the steps of depositing and selectively removing the P+ glass (which forms the contact sites in the base region) and thus the corresponding steps requiring heating and critical registration and alignment are also eliminated. In such cases where the emitter diffusion region is shallow, there is great danger of yield loss when dopant bearing glass is washing out by a corrosive etchant. For example, the base-emitter junction may be as little as 1000 A from the edge of the passivating layer which marks the boundary of the emitter contact surface. Moreover, metallization directly on such shallow emitter diffusion regions can cause further yield loss due to the probability that the metal will alloy into the semiconductor material and punch through the emitter region thereby creating an electrical short circuit. These disadvantages are substantially retarded by the use of the present invented method. The final device, after metallization, is shown, FIG. 3.

In a second embodiment of the presently preferred invention, the method steps are applied to mesa transistor technology. For example, as shown in FIGS. 4a through e, a wafer 69, with an N-type collector region 70 has a P-type base region 55 and an N-type emitter region 57. Base region 55' and emitter region 57 are formed by selectively diffusing first a P-type impurity followed by an N-type impurity as hereinbefore discussed. Generally the base region 55 has a depth in the wafer 69 approximately twice that of the emitter region 57.

Figures 4A, 4B:
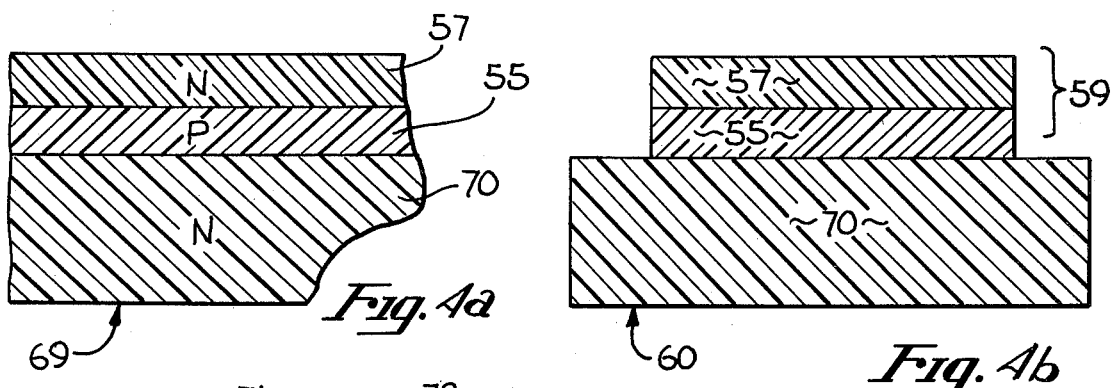
FIG. 4a through 4e are partial cross sectional views of a transistor structure at separate stages of manufacture in accordance with a second embodiment of the present invented method.
Figure 4C:
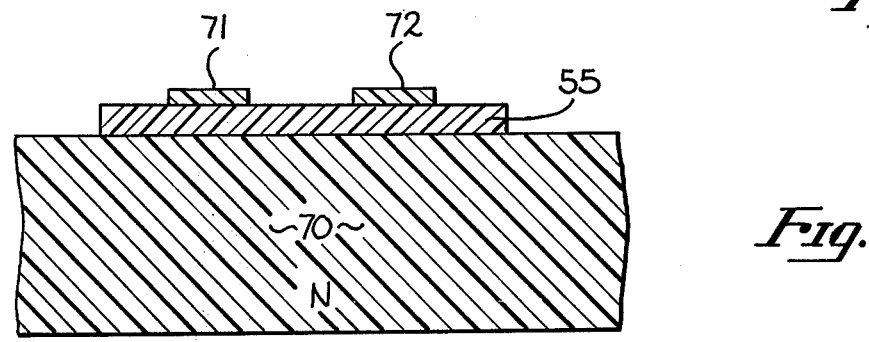
Figure 4D:
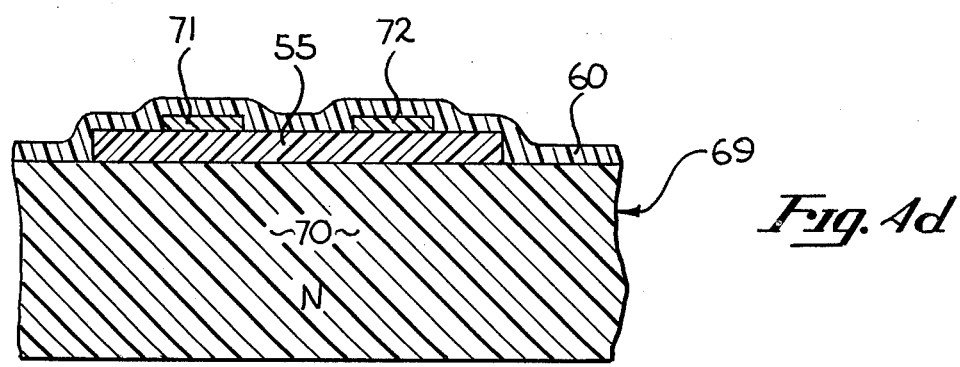

Next, areas of the base region 55 and emitter region 57 are selectively removed by known photoresist and silicon-etch techniques to define a mesa area generally shown in FIG. 4b as mesa 59. A second layer of photoresist is disposed over the entire surface and again selectively removed by known techniques thereby allowing an etchant to remove undesired emitter regions leaving emitters 71 and 72 on the base region 55 as shown in FIG. 4c.

Figure 4E:
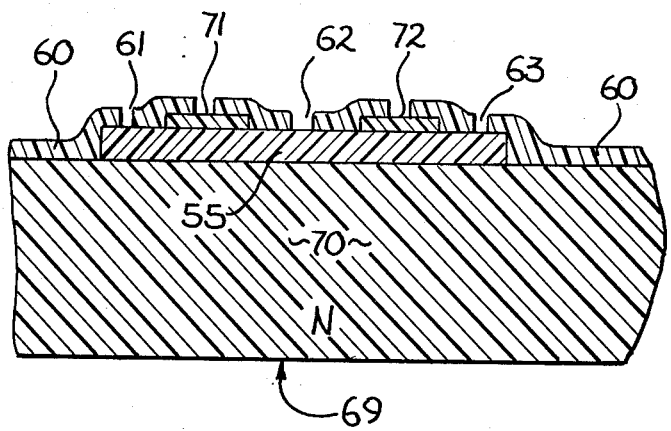

A layer of passivation 60 is now applied to protect the exposed active areas. The layer 60 is then selectively etched by the aforementioned photoresist and silicon etch means to expose base contact areas 61, 62 and 63 and the emitters 71 and 72 as indicated in FIG. 4e. Another layer of photoresist is applied over the passivating layer 60. The photoresist fills in exposed contact areas 61, 62 and 63 thereby protecting the exposed base region 5. The photoresist is then developed and selectively removed so as to allow a silicon dioxide etchant to remove the passivating layer 60 to expose the emitters 71 and 72 in areas 75 and 77. Thereafter all the photoresist is removed exposing once again, the contact sites 61, 62 and 63 as indicated in FIG. 4f. The wafer 69 is now ready for metallization. As can be seen, by first etching the active emitter region 57, subsequent heating steps generally necessary to drive the emitter region, and/or to form base contact sites in the substrate are eliminated. And this is achieved without the addition of difficult processing technology. Thus the present invented method involving the selective removal of active regions in the substrate provides the same benefits to mesa transistors as it does to planar transistors.

Figure 5A:
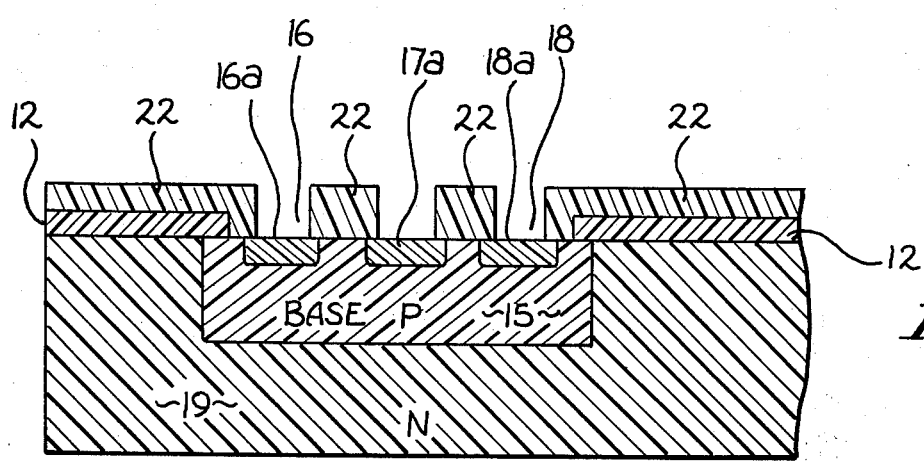
FIG. 5a–b are partial cross sectional views of a transistor structure in accordance with a third embodiment of the present invention.
Figure 5B:
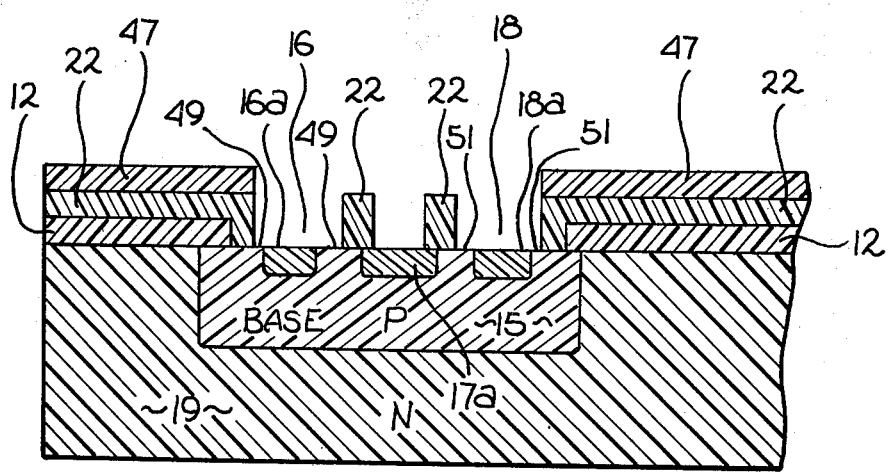

In the third embodiment of the present invention, shown in FIGS. 5a–b, emitters are diffused into the locked geometry pattern as hereinbefore discussed in steps 1a–f of the first embodiment of the present invention. In this embodiment however, the area of the base surrounding undesired emitters is exposed. When the device is metallized, "shorts" develop between these undesired emitter base junctions thereby providing base contacts. The integrity of the other emitters are thus maintained while reducing the number of process steps.

More specifically, a wafer 10 is prepared in accordance with steps 1a–f of the first embodiment of the present invention. The structure resulting from such a method, FIG. 1f, is also shown as FIG. 5a. Next, a base contact mask 47 of photoresist is disposed on the wafer 10, developed and removed thus permitting the passivating layer 22 etched through to expose undesired emitters 16a and 18a and at least sufficient area of the base 15 surrounding these emitters to form an electrical contact shown as areas 49 and 51 in FIG. 5b. This step represents a point of novelty in this embodiment of the present invention. By developing the photoresist 47 so as to expose the undesired emitter areas 16a and 18a as well as the surrounding base areas 49 and 51, the contact sites with the base are provided without the need for a glass deposition and related prior art steps. Moreover, no etching out of undesired emitter is necessary. The photoresist 47 is subsequently removed.

These areas 49 and 51 of the base 15 form the undesired emitter-base junction which subsequently are shorted out when the wafer 10 is metallized. Thus, the undesired emitter-base junction in opening 16 and 18 form the contact sites with the base 15, while opening 17 provides for the contact of emitter 17a. As already indicated, the device thus formed in the third embodiment of the present invention requires fewer processing steps and fewer high temperature steps than that required by the prior art.

Although this invention has been disclosed and described with reference to a particular embodiment, the principles involved are susceptible of other applications which will be apparent to persons skilled in the art. This invention, therefore, is not intended to be limited to the particular embodiment herein disclosed.

I claim:

1. A method for fabricating a semiconductor device having at least a first and a second active region comprising the steps of:
   a. forming a plurality of separate openings in an insulating layer disposed on a surface of said semiconductor, said semiconductor having a preferential conductivity type and determining said first active region;
   b. diffusing an impurity having an opposite conductivity type from that of said semiconductor through said plurality of separate openings in said insulating layer into separate upper regions in said semiconductor, said impurity determining a plurality of second active regions; and
   c. selectively removing some of said second active regions such that at least one of said second active regions remains whereby said first active region and said remaining second active regions are exposed through said insulating layer.

2. The method as defined in claim 1 wherein said second active regions have a depth of about 5,000 to 10,000 A.

3. The method of claim 1 wherein metal contacts are provided comprising the steps of:
   d. disposing a layer of metal over said insulating layer; and
   e. selectively removing said metal from the insualting layer, whereby said metal contacts are formed with said first and second active regions.

4. The method as defined in claim 3 wherein said metal is aluminum.

5. The method as defined in claim 1 wherein said device is heated to 930° to 1000°C for 10 to 30 minutes when said impurity is being diffused through said openings.

6. A method for fabricating a semiconductor device having base, emitter, and collector regions comprising the steps of:
   a. forming at least one opening in an insulating layer disposed on a surface of said semiconductor;
   b. diffusing a first impurity into an upper region of said semiconductor through said opening whereby said base region is formed;
   c. forming a passivating layer over said insulating layer and said opening;
   d. defining a pattern through said passivating layer over said opening whereby said base region is exposed;

e. diffusing a second impurity through said pattern into said base region said second impurity forming a plurality of emitter regions within said base region; and f. removing selected emitter regions from said base region.

7. A method as defined in claim 6 wherein said base regions have a depth of about 3,000 to 10,000 A and said emitter regions have a depth of about 1,500 to 5,000 A.

8. The method as defined in claim 6 wherein said first impurity is phosporous and said second impurity is boron.

9. The method as defined in claim 6 wherein said selected emitter regions are removed from said base region by a chemical etchant.

10. A method as defined in claim 6 wherein metal contacts are provided comprising the steps of:

g. disposing a layer of metal over said passivating layer; and h. selectively removing said metal from said passivating layer, whereby said metal contacts are formed with said emitter regions and said base regions.

11. A method for fabricating a semiconductor device of a mesa type having base, emitter and collector regions comprising the steps of:

a. diffusing first and second impurities into an upper region of said semiconductor; said first impurity forming said base region; said second impurity forming said emitter region; said second impurity diffused into said upper region of said semiconductor on top of said first impurity such that said first and second impurities are juxapositioned regions in said semiconductor;

b. etching said semiconductor so as to form at least one mesa of said base and said emitter regions;

c. removing undesired emitter regions such that said base region is exposed where said undesired emitter regions have been removed;

d. forming a passivating layer over said base regions and said emitter regions;

e. defining a pattern through said passivating layer whereby said base region and said emitter regions are exposed.

12. The method as defined in claim 11 wherein said passivating layer is silicon dioxide.

13. The method as defined in claim 11 wherein metal contacts are disposed on said emitter regions and said base regions.

14. A method for fabricating a semiconductor device having base, emitter, and collector regions comprising the steps of:

a. forming at least one opening in an insulating layer disposed on a surface of said semiconductor;

b. diffusing a first impurity into an upper region of said semiconductor through said opening whereby said base region is formed;

c. forming a passivating layer over said insulating layer and said opening;

d. defining a pattern through said passivating layer over said opening whereby said base region is exposed;

e. diffusing a second impurity through said pattern into said base region, said second impurity forming a plurality of emitter regions within said base region; and f. defining a pattern through said passivating layer such that selected emitters and a predetermined area of said base surrounding said selected emitter is exposed.

15. The method as defined in claim 14 wherein metal contacts are disposed on said selected emitters and said predetermined area of said base surrounding said selected emitters whereby base contact sites are thus formed.

* * * * *